United States Patent [19]

Powell

[11] Patent Number: 4,888,063
[45] Date of Patent: Dec. 19, 1989

[54] VARIABLE APERTURE, VARIABLE FLUX DENSITY, AEROSPACE SOLAR COLLECTOR

[76] Inventor: Roger A. Powell, 740 Jefferson St., Red Hill, Pa. 18076

[21] Appl. No.: 140,828

[22] Filed: Jan. 5, 1988

Related U.S. Application Data

[63] Continuation of Ser. No. 800,219, Nov. 21, 1985, Pat. No. 4,719,903.

[51] Int. Cl.[4] .................. H02N 6/00; H01L 31/18
[52] U.S. Cl. .................................. 136/259; 136/246; 136/290; 136/292; 437/2; 437/174; 437/247
[58] Field of Search ............... 136/245, 246, 259, 290, 136/292; 437/2, 173, 174, 247

[56] References Cited

U.S. PATENT DOCUMENTS 3,597,281  8/1971  Webb ............................. 136/245
4,494,302  1/1985  Knechtli et al. ................ 29/569.1

Primary Examiner—Aaron Weisstuch

[57] ABSTRACT

A trough-type reflecting solar concentrator and receiver system for aerospace use is disclosed. The reflecting surface is a thin flexible sheet attached to and disposed between curved ribs. The amount of the sheet reflecting sunlight can be changed by winding the unnecessary quantity of sheet onto a roll. The focal length of the curved ribs and therefore the sheet can be changed by flexurally deforming the curved ribs by applying end loads, causing a change in the flux density at the receiver. A similar result is achieved by changing the distance between the reflecting surface and the receiver. The receiver is a photovoltaic array, thermal absorber, or a combination of both. Means for proportioning the amount of energy incident on each type of receiver is disclosed. A spectral splitting thermal absorber with scattering capability is disclosed as a pre-filter for the photovoltaic array.

9 Claims, 2 Drawing Sheets

VARIABLE APERTURE, VARIABLE FLUX DENSITY, AEROSPACE SOLAR COLLECTOR

This is a continuation of application Ser. No. 800,219 filed 11/21/85, now U.S. Pat. No. 4,719,903.

BACKGROUND

The program to explore outer space has increasing requirements for electrical and thermal power. The conventional photovoltaic flat plate array may not be the optimal choice to supply the significantly larger quantities of power required by the next generation of space systems. One group of candidate replacement systems uses a curved reflector to focus the sun's energy onto a thermal absorber which transfers the energy to a working fluid that drives a heat engine/electric generator. This system promises higher overall efficiency with the disadvantage of increased complexity. The higher efficiency allows a smaller reflector aperture area for a given power output. This is a major advantage since it minimizes launch mass and low orbit aerodynamic drag. Low orbit aerodynamic drag is a major factor since it causes the orbit to decay, requiring a fuel-consuming rocket firing to re-achieve the original orbit. Therefore, the lower the required aperture, the lower the aerodynamic drag, the lower the mass of re-boost fuel that must launched.

Lightweight reflectors may be made by using a thin film as the reflective material. Of particular interest are those disclosures that form the film into a parabolic trough reflector. Simpson in U.S. Pat. No. 4,173,397 describes a thin film reflector sheet (22) stretched over wires (20) or rods (70) in a terrestrial environment protected from wind and rain. A major disadvantage of this invention is the lack of a smooth contour. The reflective areas between the wires or rods are planar (see FIG. 3); therefore, the reflector is an array of flat facets. This severely limits the optical concentration potential and therefore the overall effeciency potential of this device. Cohen in U.S. Pat. No. 4,184,482 describes a trough reflector for use under terrestrial roof rafters. The film (30) is stretched between two frames (32) which are held apart by a biasing spring (64) at the tubular member (24). The trough reflector assembly rotates about the tubular member (24) to track the sun. Bronstein in U.S. Pat. No. 4,293,192 describes a stretched film terrestrial trough reflector made of a reflector sheet (46) attached to forms (22) and (24) which are moved apart on a slideway (26) by a nut (38). Eaton in U.S. Pat. No. 4,493,313 describes a terrestrial trough collector using a stretched film (16) attached to parabolic end formers (18) which are forced apart by a spreader bar (12). All of the foregoing are directed to terrestrial use and are not adaptable to transportation into space or use in space. All of the foregoing have a rigid connection between the film or foil and the end formers such that the aperture area cannot be changed. Also, the end formers are rigid (rather than flexible) with respect to their curved (parabolic) shape, thereby creating a reflecting surface with a fixed focal length.

SUMMARY OF THE INVENTION

One object of this invention is to provide a lightweight, parabolic trough solar collector that is readily transportable into space and readily erectable or deployable in space, particularly in low earth orbit. Another object of this invention is to provide a parabolic trough solar collector that has a variable aperture such that its collecting power capability and its aerodynamic drag can be changed. Another object of this invention is to provide a parabolic trough solar collector with a combination of electrical and thermal energy converters and means to vary the percentage of energy striking them. Another object is to provide a parabolic trough solar collector with a variable focal length reflector to allow the flux density and distribution at the focus to be varied.

The present invention uses a curved reflector of the trough type to focus the sun's energy onto an elongated receiver assembly. The curved reflector is composed of a stretched reflective film attached to transverse ribs that are in a parabolic shape. The receive assembly is composed of a photovoltaic cell array with a spectrally selective filter. The spectrally selective filter is a thermal absorber using a circulating fluid. It absorbs those portions of the sun's spectrum to which the photovoltaic cell is not responsive and transmits those portions of the spectrum to which the cell is responsive.

Another embodiment uses flexible transverse ribs that can be made to have an adjustable focal length. The focal length determines the energy distribution entering the receiver assembly. In this embodiment, the receiver assembly contains an array of absorbers that convert the concentrated flux into electrical and/or thermal power. The amount of energy incident on each absorber can be varied by changing the focal length of the reflector and/or the alignment of the reflector axis with the sun.

Another embodiment allows the amount of stretched reflective film material to be varied. This allows the collection aperture to be tailored to the electrical and thermal power loads as they vary over time. Therefore, the aperture area and the associated aerodynamic drag are minimized for a given mission profile. This minimises the fuel requirements to re-acquire the original orbit after orbital decay due to aerodynamic drag.

DETAILED DESCRIPTION OF THE DRAWINGS

Figure 2:
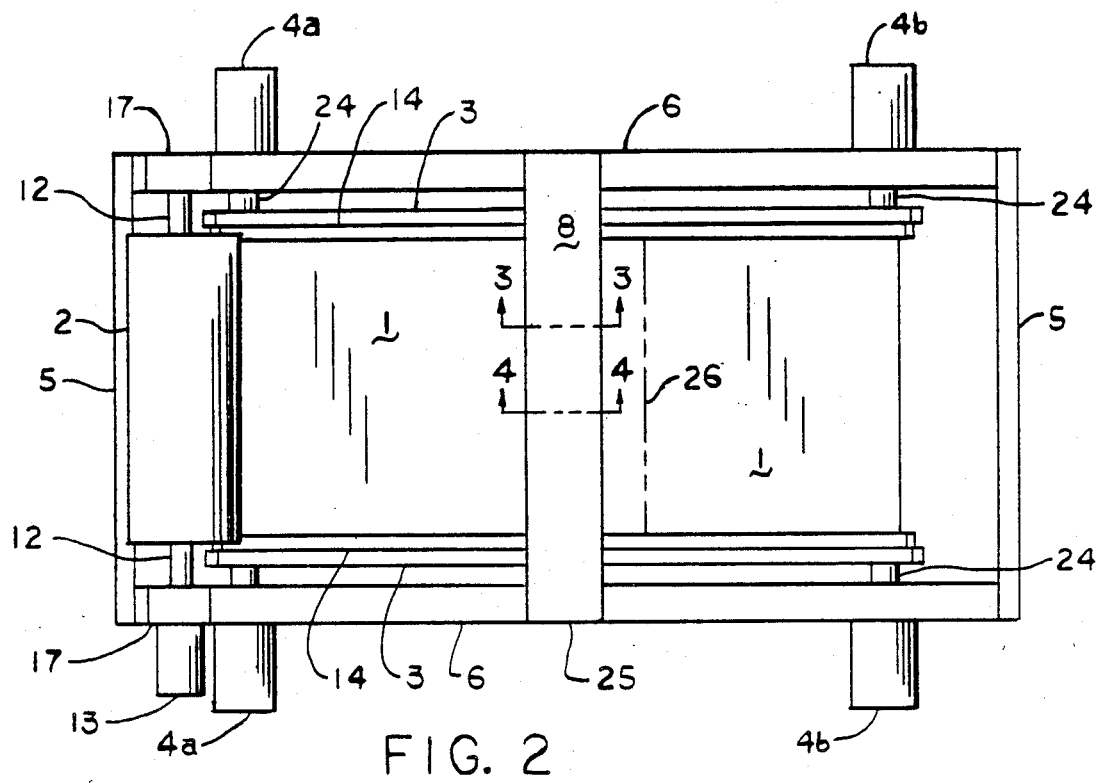
FIG. 2 shows a top view of the solar collector as it would be seen if viewed from the sun. The longitudinal axis is vertical.
Figure 1:
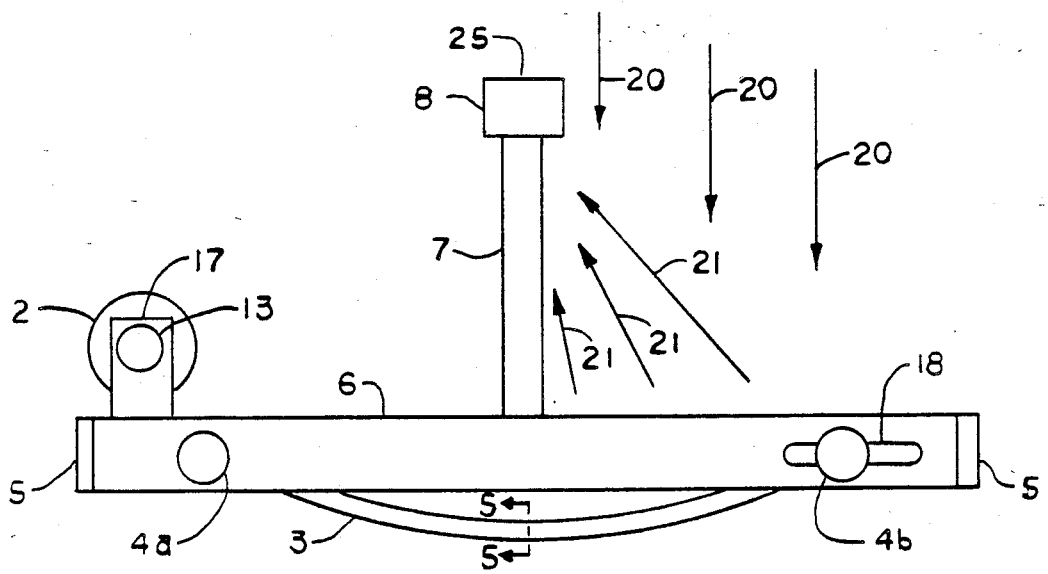
FIG. 1 shows an end view of the solar collector, looking parallel to the longitudinal axis.
Figure 5:
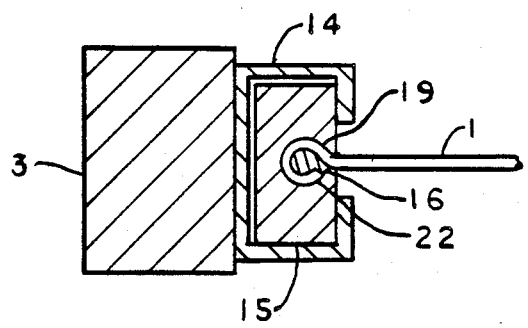
FIG. 5 shows a cross-sectional view of a rib member, the film, and the sliding attachment between them.

FIGS. 1 and 2 show the preferred embodiment of the solar collector in two views. The reflecting material is a thin film (1) of silvered or aluminized Mylar or Kapton (both are trademarks of the DuPont Co.) stretched, in the direction of the longitudinal axis, between and attached to elastically deformed curved rib members (3), which have axes transverse to the longitudinal axis. Alternatively, the reflecting material can be a thin metallic or plastic sheet. The curved rib members (3) are attached at their ends to the shafts (24) of torque producing motors (4). The curved rib members are initially straight and will return to the straight condition when they are not stressed; therefore, they are stressed only within the elastic range of their material properties. The frames or bodies of the motors (4a) at one set of ends of the curved rib members (3) are rigidly fixed to transverse frame members (6). The frames of motors (4b) at the other set of ends of the curved rib members (3) are mounted to blocks (not shown) which are captured in slots (18) in the transverse frame members (6) such that they may move toward the center of the collector as they exert torque on the curved rib members (3) and curved rib members (3) deform into a curved shape. The theoretical development of this process is more completely described in my U.S. Pat. No. 4,119,365, which is incorporated by reference. The transverse frame members (6) are spaced apart by elongated longitudinal frame members (5), which are attached at the ends of the transverse frame members (6), and which are parallel to the longitudinal axis. Receiver struts (7) are attached to each of the transverse frame members (6) at their midpoints, and support the receiver assembly (25) and the receiver cover (8) at their opposite ends. Alternatively, the receiver assembly (25) could be supported by multiple struts, to form a truss for increased structural stiffness, if required by the orbital dynamics. Light from the sun approaches the solar collector with virtually parallel rays (20) which are reflected by the film (1) to focus converging rays (21) at the receiver. Only one side of this optical process is shown for clarity in FIG. 1. The film (1) is made from a continuous roll of film. To each transverse edge of the film(1) is attached a sliding member (15) which is a continuous elongated member with a hollow longitudinal core (19) as shown in FIG. 5. The film (1) is wrapped into a small loop (22) and placed in the hollow core (19). A thermosetting filler/adhesive (16) such as an epoxy compound or the like can be injected from one end to fill the hollow core (19) which is now lined with the film loop (22), thus firmly attaching the film (1) edge to the sliding member (15). The sliding member (15) is captured in a box member (14) which has a slot for the film (1). The box member (14) is attached to each curved rib member (3), such that it deforms in the same manner as the curved rib member (3). Supported by lugs (17) attached to the transverse frame members (6) is the film roll shaft (12) which in turn supports the film roll (2). Coupled to the film roll shaft (12) is the armature of the film roll motor (13). The stator or frame of the film roll motor (13) is attached to the lug (17).

Figure 3:
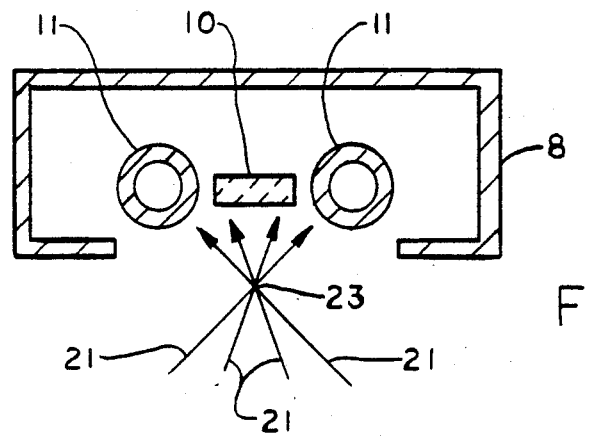
FIG. 3 shows the receiver assembly in cross-section with the in-line (serial) thermal and electric converter embodiment.

One edge of the film (1) parallel to the longitudinal axis and the adjacent ends of the sliding members (15) attached to the transverse edges of the film (1) are attached to the film roll (2). By energizing the film roll motor (13), the film (1) and the attached sliding members (15) may be wound onto the film roll (2). During this operation, the film (1) and the sliding members (15) are retracted in the box members (14). This decreases the effective collecting area or aperture of the reflector; reducing the output power potential to that required by the spacecraft at that point in time; and also reducing the area exposed to aerodynamic drag, thereby reducing the drag losses. The edge (26) of the film (1) in the partially retracted position is shown in FIG. 2. FIG. 3 shows the preferred embodiment of the receiver of the concentrated solar flux (21), which focuses at a location (23) in front of the receiver aperture. As the flux diverges from the focus location (23), it strikes a photovoltaic cell (10) or the like which converts the flux into electrical energy. The flux also strikes and is absorbed by two thermal receivers (11), in the form of hollow conduits transporting a heat transfer fluid such as water or a high temperature oil, that convert the flux into thermal energy. As shown in FIG. 3, the focus location (23) causes flux to strike the photovoltaic cell (10) and the thermal receivers (11). If the effective radius of curvature of the reflector were lengthened by decreasing the torque applied by the motors (4) on the curved rib members (3), the focus location (23) will move toward the receiver aperture. As this happens, decreasing amounts of flux fall on the thermal receivers (11), and a more concentrated flux falls on the photovoltaic cell (10). In this manner, the proportion of the incoming energy to each type of device can be changed to match the prevailing load requirements. Similarly, the entire collector assembly may be rotated in spaced to be slightly misaligned to the sun, thus causing the focus location to move laterally left or right in FIG. 3. This would cause a shift in the power, proportioning toward the thermal receivers (11), Also, the focus location (23) can be placed very close to the surface of the photovoltaic cell (10) and traversed across it by changing the optical alignment of the collector with respect to the sun. This produces local heating that can anneal the cell, which repairs any accummulated radiation damage and acts to rejuvenate the cell. The thermal receivers (11) and the photovoltaic cell (10) are attached to the receiver cover (8) by appropriate brackets, not shown. Another method of changing the flux density of the concentrated radiant energy at the photovoltaic cell (10) or any other receiver is to move the receiver along the optical axis with respect to the reflector while the focal length is held constant. This can be accomplished by changing the length of the receiver struts (7) by means of a jack screw or the like or by repositioning the photovoltaic cell within the receiver assembly (25) by similar means.

Figure 4:
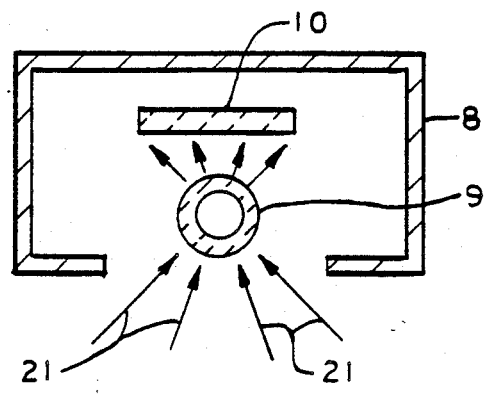
FIG. 4 shows the receiver assembly in cross-section with the abreast (parallel) thermal and electric converter embodiment.

FIG. 4 shows another embodiment of the receiver. Concentration flux (21) strikes a selective absorption filter (8) utilizing a circulating fluid in a hollow conduit as the energy transport system. The selective absorption filter (9) absorbs those wavelengths of light to which the photovoltaic cell is not sensitive and converts the energy to heat which the fluid transports to a thermal load. Typically, the photovoltaic cell is not sensitive to ultraviolet or infrared portions of the spectrum. The selective absorption filter (9) is transparent to those wavelengths of light to which the photovoltaic cell (10) is sensitive, transmitting them to the photovoltaic cell (10) for conversion to electrical power. The filter (9) and the photovoltaic cell (10) are attached to the receiver cover (8) by appropriate brackets, not shown. A more complete description of the selective spectral absorber filter is in my U.S. Pat. No. 4,278,829, which is incorporated by reference. In this embodiment, the fluid is preferred to be the selective absorber itself, thereby directly absorbing the portion of the spectrum that is non-productive for the generation of electrical power by the photovoltaic cell (10).

The focus of the concentrated flux (21) is located at the center of the selective absorption filter (9). Although, the selective absorption filter conduit is shown as a circular member, other cross-sectional shapes will provide like functions. Also, the photovoltaic cell may be manufactured to be transparent to non-productive radiation, such as infrared. In this case, the concentrated flux would strike the photovoltaic cell first, and the non-productive radiation would be transmitted to a thermal absorber located behind the cell; i.e. the cell and the thermal absorber would be reversed in position from that shown in FIG. 4. Obviously, there are a number of arrangements of absorbing elements, each having advantages for a particular desired result. In the configuration shown in FIG. 4, the spectrally selective absorption fluid circulating in the selective absorption filter (9) should also contain a scattering agent that scatters the transmitted radiant energy as it passes through the fluid. An example of a scattering agent is a quantity of small glass microspheres being carried by the fluid and having the same density as the fluid to produce neutral buoyancy. Alternatively, the conduit itself may be etched or "frosted" to produce a "ground glass" effect. The purpose of the scattering agent is to scatter the radiant energy to which the photovoltaic cell is sensitive and thereby make the flux density at the surface of the phototaic cell more uniform. The efficiency of the cell is maximized at the most uniform flux density. This is very important since trough type concentrators produce linear flux variations at the focus of the reflector.

The thermal energy collected from the thermal absorbers (11) may be used to power to heat engine using an organic fluid such as toluene and operating on an organic Rankine thermodynamic cycle and driving an alternator producing AC electrical power. It will be advantageous to use AC power for some aspects of our future space power requirements while the photovoltaic cells provide DC power. Alternatively, if large heat loads must be supplied at reasonable temperatures, it will be advantageous to transport the thermal energy as sensible heat in a heat transfer fluid and avoid the enormous efficiency losses of converting first to electricity, to be used as the transport medium, then back to heat at the thermal load. The thermal energy may also be transported as a phase change in the fluid, such as water into steam at the heat absorption point and steam into water at the thermal load.

Although the curved rib members (3) are shown as a constant cross-section elements that are elastically deformed into the parabolic shape, they may be of other configurations such as a structural truss. Small forces may also be applied at the ends and/or other locations on the curved rib members (3) to 'fine-tune' the shape toward a perfect parabola. The curved rib members (3) may also be initially formed into the parabolic shape, rather than relying on the end moments applied by the motors (4), to form them into the parabolic shape. If the motors (4) are eliminated, the change in focal length can't be accomplished but all other functions can be performed. A combination of initially curved rib members (3) and motors (4) to effect changes in focal length is one of the other possible combinations within the scope of this invention.

The variable aperture function produced by the movement of the film (1) with respect to the curved rib members (3) can be produced by relocating the film roll (2) to the center of the reflector and unrolling two webs that are interleaved on the film roll (2) in opposite directions. Alternatively, two film rolls could be used at the center or at the the outboard ends to provide redundancy. Alternatively, the storage mechanism could use an accordion-type pleating of the film (1).

As can be seen from FIGS. 1 and 2, the elements of the solar collector are slender elongated members, which, when laid side by side, lend themselves to a compact shipping envelope for transportation into space. Also, the film roll (2) can be used as the transport mechanism for the film (1) and the attached sliding members (15). Since there are a small number of joints, the erection in space by astronauts or robots is relatively simple. After the structural connections are made, the ends of the sliding members (15) are inserted into the ends of the box members (14) and the collector assembly is complete. A number of techniques are being developed to build structural beams in space and to deploy collapsible/extendable beams. These items could be easily utilized in my invention.

Using members of less than 18 meters in length to fit into the Space Shuttle cargo bay would produce an approximately 15 meters by 15 meters aperture with the film fully extended. This would intercept about 315 kilowatts of power. At a conversion efficiency of 15%, using gallium arsenide photovoltaic cells, the power output would be 47 kilowatts. Two units would be required to satisfy the present space station requirement of 75 kilowatts, thereby providing modularity and redundancy.

An alternative embodiment places the receiver assembly with an array of reflective facets or the like that redirect the concentrated energy reflected from the film (1) to a point focus near the center of the reflective surface where an absorber/converter is located.

While this invention has been described in conjuction with the preferred embodiment thereof, it is obvious that modifications and changes therein may be made by those skilled in the art to which it pertains without departing from the spirit and scope of this invention, and as defined by the claims appended hereto.

I claim:

1. A method for annealing photovoltaic cells in space, said cells being substantially at the focus of a solar energy concentrator, said focus having a flux density and an effective area, comprising the steps of:
   increasing said flux density of said focus and decreased said effective area of said focus on said cells, thereby causing increased localized heating in said effective area on said cells, said localized heating acting to rejuvenate electrical characteristics of said cells;
   moving said effective area across said cells, thereby subjecting additional surface area of said cell to said localized heating.

2. A method as recited in claim 1, wherein said step of increasing said flux density and decreasing said effective area comprises changing the radius of curvature of said solar energy concentrator.

3. A method as recited in claim 1, wherein said step of moving said effective area comprises changing the optical alignment of said solar energy concentrator with respect to the sun.

4. A method as recited in claim 1, wherein said step of increasing said flux density and decreasing said effective area comprises changing the distance between the cells and the solar energy concentrator.

5. A solar collector for use in space, comprising:
   a curved reflector which redirects incoming solar energy to a focus location,
   a photovoltaic cell, positioned in proximity to said focus location, said cell intercepting said energy, said intercepted energy having a flux density and an effective area,
   means for remotely increasing said flux density and decreasing said effective area, thereby producing localized heating in said effective area.

6. A solar collector as recited in claim 5, further comprising means for moving said effective area across said cells, thereby subjecting additional portions of said cells to said localized heating.

7. A solar collector as recited in claim 5, wherein said means for remotely increasing said flux density and decreasing said effective area comprises means for changing the radius of curvature of said curved reflector.

8. A solar collector as recited in claim 5, wherein said means for remotely increasing said flux density and decreasing said effective area comprises means for changing the distance between said curved reflector and said photovoltaic cell.

9. A solar collector as recited in claim 6, wherein said means for moving said effective area across said cells comprises means for changing the optical alignment of said curved reflector with respect to the sun.

* * * * *